United States Patent
Nagai et al.

(10) Patent No.: US 10,068,915 B2
(45) Date of Patent: Sep. 4, 2018

(54) MANUFACTURING METHOD FOR A SEMICONDUCTOR DEVICE INCLUDING RESIST FILMS DIFFERENT IN THICKNESS

(71) Applicant: TOSHIBA MEMORY CORPORATION, Minato-ku (JP)

(72) Inventors: Satoshi Nagai, Yokkaichi (JP); Eiji Yoneda, Yokkaichi (JP); Kentaro Matsunaga, Yokkaichi (JP); Koutarou Sho, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/375,321

(22) Filed: Dec. 12, 2016

(65) Prior Publication Data
US 2017/0092656 A1  Mar. 30, 2017

Related U.S. Application Data

(62) Division of application No. 14/748,764, filed on Jun. 24, 2015, now abandoned.

(60) Provisional application No. 62/127,455, filed on Mar. 3, 2015.

(51) Int. Cl.
*H01L 21/4763* (2006.01)
*H01L 27/11582* (2017.01)
*H01L 21/768* (2006.01)

(52) U.S. Cl.
CPC .. *H01L 27/11582* (2013.01); *H01L 21/76805* (2013.01); *H01L 21/76816* (2013.01); *H01L 21/76828* (2013.01); *H01L 21/76832* (2013.01); *H01L 21/76895* (2013.01)

(58) Field of Classification Search
None
See application file for complete search history.

(56) References Cited

U.S. PATENT DOCUMENTS

| | | | |
|---|---|---|---|
| 7,558,141 B2 | 7/2009 | Katsumata et al. | |
| 2013/0095654 A1 | 4/2013 | Kwon et al. | |
| 2014/0021632 A1 | 1/2014 | Lee et al. | |
| 2014/0306279 A1* | 10/2014 | Park | H01L 29/7889 257/314 |
| 2016/0064281 A1 | 3/2016 | Izumi et al. | |

FOREIGN PATENT DOCUMENTS

| | | |
|---|---|---|
| JP | 2005-331651 | 12/2005 |
| JP | 2007-67337 | 3/2007 |
| JP | 2008-171839 | 7/2008 |
| JP | 2011-248306 | 12/2011 |
| JP | 2012-252183 | 12/2012 |
| KR | 10-2013-0007200 | 1/2013 |
| KR | 10-1250851 B1 | 3/2013 |
| KR | 10-2014-0122890 A | 10/2014 |

OTHER PUBLICATIONS

Office Action dated Aug. 23, 2016 in Korean Patent Application No. 10-2015-0104337 with English translation.

* cited by examiner

*Primary Examiner* — Hung Vu
(74) *Attorney, Agent, or Firm* — Oblon, McClelland, Maier & Neustadt, L.L.P.

(57) ABSTRACT

According to one embodiment, a semiconductor device includes a stacked body of N (N is an integer of 2 or more) layers stacked on a semiconductor substrate and openings different in depth surrounded by the stacked body and separated from each other.

2 Claims, 11 Drawing Sheets

FIG.1F

MANUFACTURING METHOD FOR A SEMICONDUCTOR DEVICE INCLUDING RESIST FILMS DIFFERENT IN THICKNESS

CROSS-REFERENCE TO RELATED APPLICATIONS

This application is a divisional application of U.S. application Ser. No. 14/748,764, filed Jun. 24, 2015 which is based upon and claims the benefit of priority from U.S. Provisional Application No. 62/127,455, filed on Mar. 3, 2015; the entire contents of each of which are incorporated herein by reference.

FIELD

Embodiments described herein relate generally to a semiconductor device, a manufacturing method for a semiconductor device, and a nontransitory computer readable medium storing a pattern generating program.

BACKGROUND

To make a semiconductor device with a higher degree of integration, the semiconductor device may use a three-dimensional structure. In the three-dimensional structure, steps may be provided between layers in a contact region to extract individual wires from the layers. There is a method for forming such steps by which to repeatedly perform lithography and etching according to the number of the steps.

BRIEF DESCRIPTION OF THE DRAWINGS

FIGS. 1B to 1F are cross-sectional views illustrating the manufacturing method for a semiconductor device according to the first embodiment;

DETAILED DESCRIPTION

In general, according to one embodiment, a semiconductor device includes a stacked body of N (N is an integer of 2 or more) layers stacked on a semiconductor substrate, and openings different in depth surrounded by the stacked body and separated from each other.

Exemplary embodiments of a semiconductor device and a manufacturing method for a semiconductor device will be explained below in detail with reference to the accompanying drawings. The present invention is not limited to the following embodiments.

First Embodiment

Figure 1A:
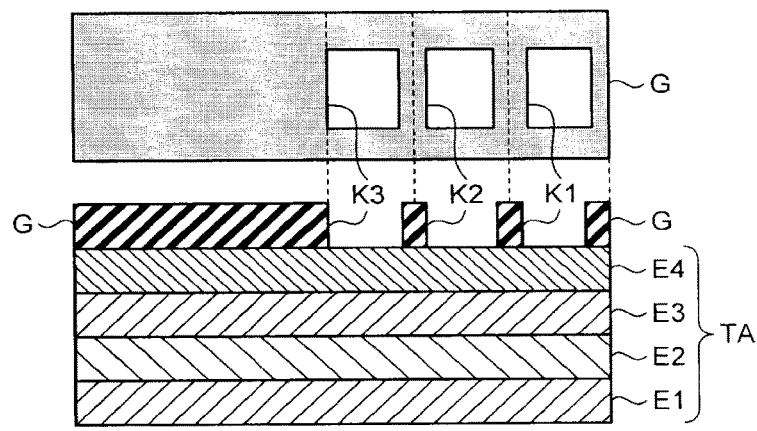
FIG. 1A is a plan view illustrating a manufacturing method for a semiconductor device according to a first embodiment.

FIG. 1A is a plan view illustrating a manufacturing method for a semiconductor device according to a first embodiment, and FIGS. 1B to 1F are cross-sectional views illustrating the manufacturing method for a semiconductor device according to the first embodiment.

Figure 1B:
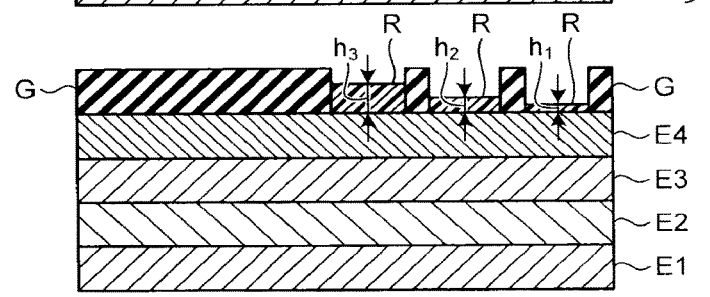

Referring to FIGS. 1A and 1B, a stacked body TA is provided as a three-dimensional structure. A guide pattern G is formed on the stacked body TA by the use of a lithography technique. The guide pattern G has openings K1 to K3 formed therein. The stacked body TA may be provided with four layers E1 to E4. The layers E1 to E4 may be provided with wiring layers, for example. The wiring layers may be provided with word lines, for example. In this case, the stacked body TA has word lines and insulating films alternately stacked. The material for the guide pattern G may be a hard mask material such as $SiO_2$ or a carbon-based resist material.

Figure 1C:
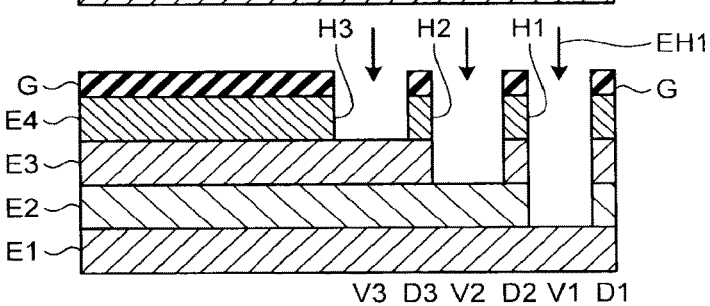

Next, as illustrated in FIG. 1C, a resist R is charged into the openings K1 to K3. Film thicknesses $h_1$, $h_2$, and $h_3$ of the resist R in the openings K1 to K3 may be set to establish the relationship $h_3 > h_2 > h_1$. When the guide pattern G is formed from a resist material, the material selected for the resist R may be lower in reflow temperature than the resist material for the guide pattern G. The film thickness of the guide pattern G may be set such that the guide pattern G is not deleted by etching EH1. To cause differences among the film thicknesses $h_1$, $h_2$, and $h_3$ of the resist R when the openings K1 to K3 are equal in area, the resist R may be varied in volume in the openings K1 to K3 and may reflow to flatten the resist R in each of the openings K1 to K3. Alternatively, the resist R may be charged into the openings K1 to K3 by an ink-jet technique.

Figure 1D:
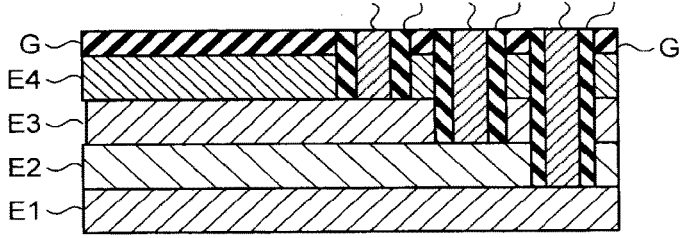

Next, as illustrated in FIG. 1D, the stacked body TA is subjected to etching EH1 via the resist R with the film thicknesses $h_1$, $h_2$, and $h_3$ to form contact holes H1, H2, and H3 different in depth in the stacked body TA. In this case, when the layers E1 to E4 are provided with wiring layers, a wire in the layer E1 may be exposed through the contact hole H1, a wire in the layer E2 may be exposed through the contact hole H2, and a wire in the layer E3 may be exposed through the contact hole H3. At that time, the film thicknesses $h_1$, $h_2$, and $h_3$ may be adjusted in such a manner that, when the wire in the layer E1 is exposed through the contact hole H1, the wire in the layer E2 is exposed through the contact hole H2 and the wire in the layer E3 is exposed through the contact hole H3. After the formation of the contact holes H1, H2, and H3, the guide pattern G may be removed.

Figure 1E:
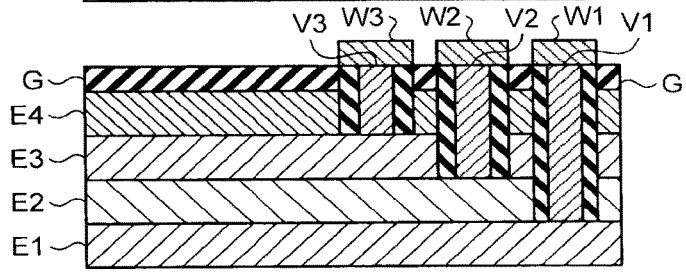

Next, as illustrated in FIG. 1E, side-wall insulating films D1 to D3 are formed on side walls of the contact holes H1 to H3 respectively, and then contact plugs V1 to V3 are embedded into the contact holes H1 to H3, respectively.

Next, as illustrated in FIG. 1F, extracted lines W1 to W3 connected to the layers E1 to E3 via the contact plugs V1 to V3 are formed on the stacked body TA, respectively.

In this case, etching the stacked body TA via the resist R with different film thicknesses makes it possible to form the contact holes H1 to H3 different in depth in one etching process. This eliminates the need to perform repeatedly the etching process for formation of the contact holes H1 to H3 different in depth, which results in reduction of the number of processes. In addition, providing the guide pattern G on the stacked body TA for formation of the resist R with different film thicknesses on the stacked body TA makes it possible to prevent that the resist R charged into the openings K1 to K3 flows to the outside. Accordingly, it is possible to provide the film thicknesses $h_1$, $h_2$, and $h_3$ of the resist R with higher accuracy, thereby obtaining the depths of the contact holes H1 to H3 different in depth with higher accuracy.

Second Embodiment

Figure 2A:
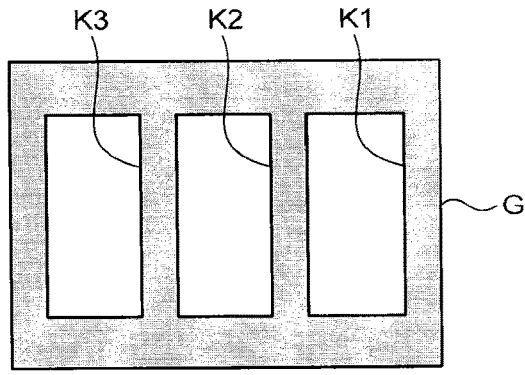
FIGS. 2A and 2C are plan views illustrating a manufacturing method for a semiconductor device according to a second embodiment.
Figure 2B:
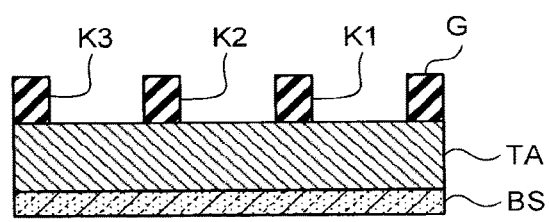
FIGS. 2B and 2D are cross-sectional views illustrating the manufacturing method for a semiconductor device according to the second embodiment.
Figure 2C:
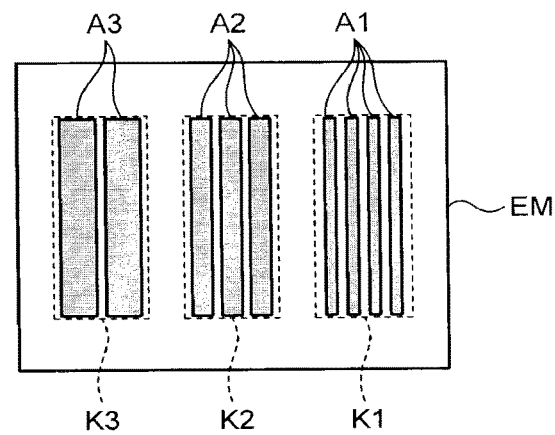

FIGS. 2A and 2C are plan views illustrating a manufacturing method for a semiconductor device according to a second embodiment, and FIGS. 2B, 2D, and 3A to 3D are cross-sectional views illustrating the manufacturing method for a semiconductor device according to the second embodiment.

Referring to FIGS. 2A and 2B, the stacked body TA is formed on a foundation layer BS, and the guide pattern G is formed on the stacked body TA by the use of a photolithographic technique. The guide pattern G has the openings K1 to K3.

The foundation layer BS may be a semiconductor substrate, an insulator, or an electric conductor. The foundation layer BS may have an integrated circuit thereon.

Figure 2D:
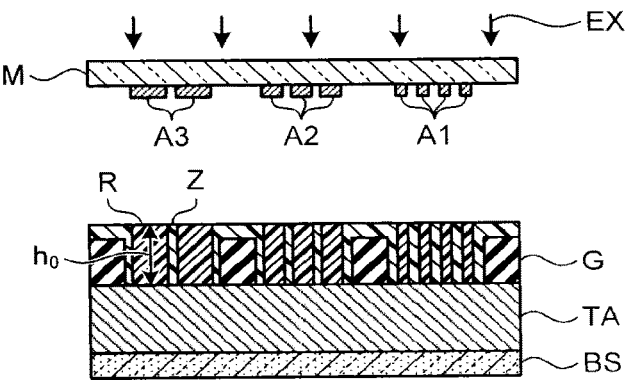

Next, referring to FIGS. 2C and 2D, the resist R is uniformly applied to the stacked body TA by a method such as spin coating, and the resist R is irradiated with exposure light EX via an exposure mask EM to form in the resist R a latent image Z of light-shielding patterns A1 to A3 on the exposure mask EM. The film thickness of the resist R may be set to $h_0$ in each of the openings K1 to K3. The light-shielding patterns A1 to A3 on the exposure mask EM have slits formed therein, and the shapes of the light-shielding patterns A1 to A3 are decided in correspondence with the openings K1 to K3, respectively. For example, the number of the slits may be different among the openings K1 to K3. Alternatively, the width of the slits may be different among the openings K1 to K3.

Figure 3A:
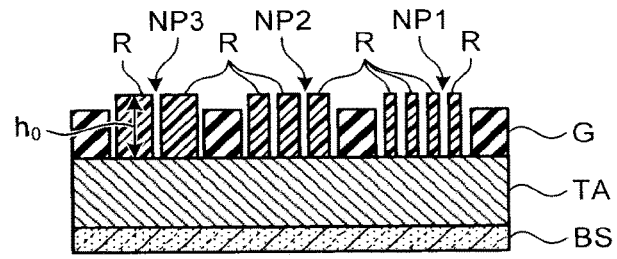
FIGS. 3A to 3D are cross-sectional views illustrating the manufacturing method for a semiconductor device according to the second embodiment.

Next, as illustrated in FIG. 3A, the resist R with the latent image Z is developed to form extracted patterns NP1 to NP3 in the openings K1 to K3 on the resist R, respectively.

Figure 3B:
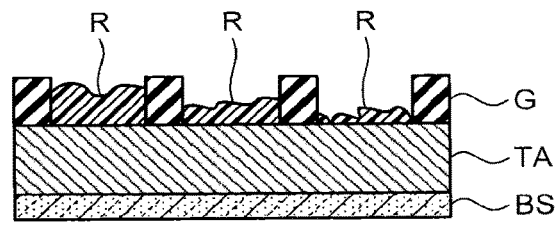

Next, as illustrated in FIG. 3B, the resist R is thermally processed and caused to reflow. The temperature for the thermal processing may be set to be equal to or higher than the glass-transition temperature of the resist.

Figure 3C:
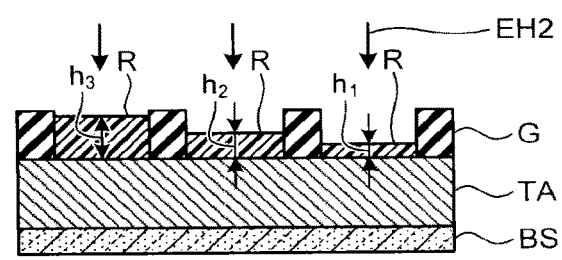

Next, as illustrated in FIG. 3C, the resist R is subjected to etching EH2 to flatten the resist R and set the film thicknesses of the resist R to $h_1$, $h_2$, and $h_3$ in the openings K1 to K3, respectively. When the resist R is fully flattened by the reflow in FIG. 3B, the step in FIG. 3C may be omitted. In this case, the coverage ratio of the resist R in the opening K1 in FIG. 3A may be set to $h_1/h_0$, the coverage ratio of the resist R in the opening K2 in FIG. 3A may be set to $h_2/h_0$, and the coverage ratio of the resist R in the opening K3 in FIG. 3A may be set to $h_3/h_0$. In addition, when the area of the light-shielding pattern A1 is designated as $A_1$ and the area of the opening K1 is designated as $K_1$, the area $A_1$ can be expressed by $A_1=K_1 \times h_1/h_0$. When the area of the light-shielding pattern A2 is designated as $A_2$ and the area of the opening K2 is designated as $K_2$, the area $A_2$ can be expressed by $A_2=K_2 \times h_2/h_0$. When the area of the light-shielding pattern A3 is designated as $A_3$ and the area of the opening K3 is designated as $K_3$, the area $A_3$ can be expressed by $A_3=K_3 \times h_3/h_0$.

Figure 3D:
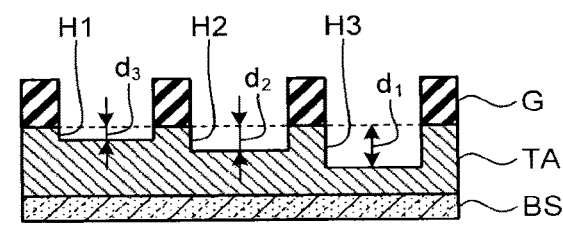

Next, as illustrated in FIG. 3D, the stacked body TA is etched via the resist R with the film thicknesses $h_1$, $h_2$, and $h_3$ to form contact holes H1, H2, and H3 different in depth on the stacked body TA. The contact holes H1, H2, and H3 may have depths $d_1$, $d_2$, and $d_3$, respectively, to be in the relationship $d_1 > d_2 > d_3$. For example, at the time of etching EH2, when the etching rate of the resist R is designated as EHR and the etching rate of the stacked body TA is designated as EHA, $h_2 - h_1 = \Delta h$ may be expressed by the following equation:

$$\Delta h = \Delta d \times EHR/EHA$$

where $\Delta d = d_2 - d_1$.

Forming the extracted patterns NP1 to NP3 on the resist R makes it possible to control the volume of the resist R in the openings K1 to K3 with higher accuracy and provide the film thicknesses $h_1$, $h_2$, and $h_3$ with higher accuracy. In addition, providing the guide pattern G on the stacked body TA makes it possible to prevent the resist R charged into the openings K1 to K3 from outflowing at the time of reflow, and prevent the film thicknesses $h_1$, $h_2$, and $h_3$ from deviating from set values.

Figure 4A:
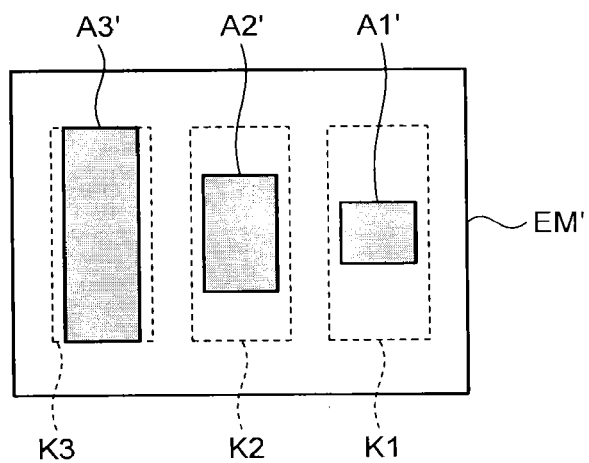
FIGS. 4A and 4B are cross-sectional views illustrating a manufacturing method for a semiconductor device according to a third embodiment.
Figure 4A:
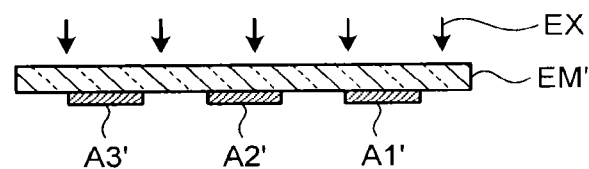
Figure 4B:
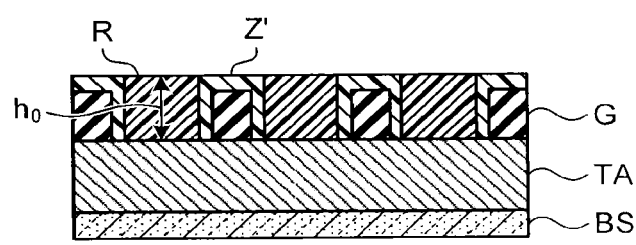

FIGS. 4A and 4B are cross-sectional views illustrating a manufacturing method for a semiconductor device according to a third embodiment.

In the example of FIG. 4A, an exposure mask EM' is provided instead of the exposure mask EM. The exposure mask EM' has light-shielding patterns A1' to A3' instead of the light-shielding patterns A1 to A3 in FIG. 2C. While the exposure mask EM has the light-shielding patterns A1 to A3 with slits for area adjustment, the exposure mask EM' has the light-shielding patterns A1' to A3' cut out at outer peripheries for area adjustment, and the light-shielding patterns A1' to A3' are made continuous in the openings K1 to K3, respectively.

Next, as illustrated in FIG. 4B, the resist R is uniformly applied to the stacked body TA by a method such as spin coating. In this case, the film thickness of the resist R may be set to $h_0$ in each of the openings K1 to K3. Next, the resist R is irradiated with exposure light EX via the exposure mask EM' to form a latent image Z' on the resist R. In this case, the latent image Z' may be formed on the resist R in correspondence with the cut portions of the light-shielding patterns A1' to A3'.

In the example of FIG. 4A, the line widths of the patterns and the intervals between the patterns can be larger than those in the example of FIG. 2C. Accordingly, in the example of FIG. 4A, the resolution at the time of exposure can be lowered to decrease costs for exposure processing, as compared to the example in FIG. 2C.

Figure 5:
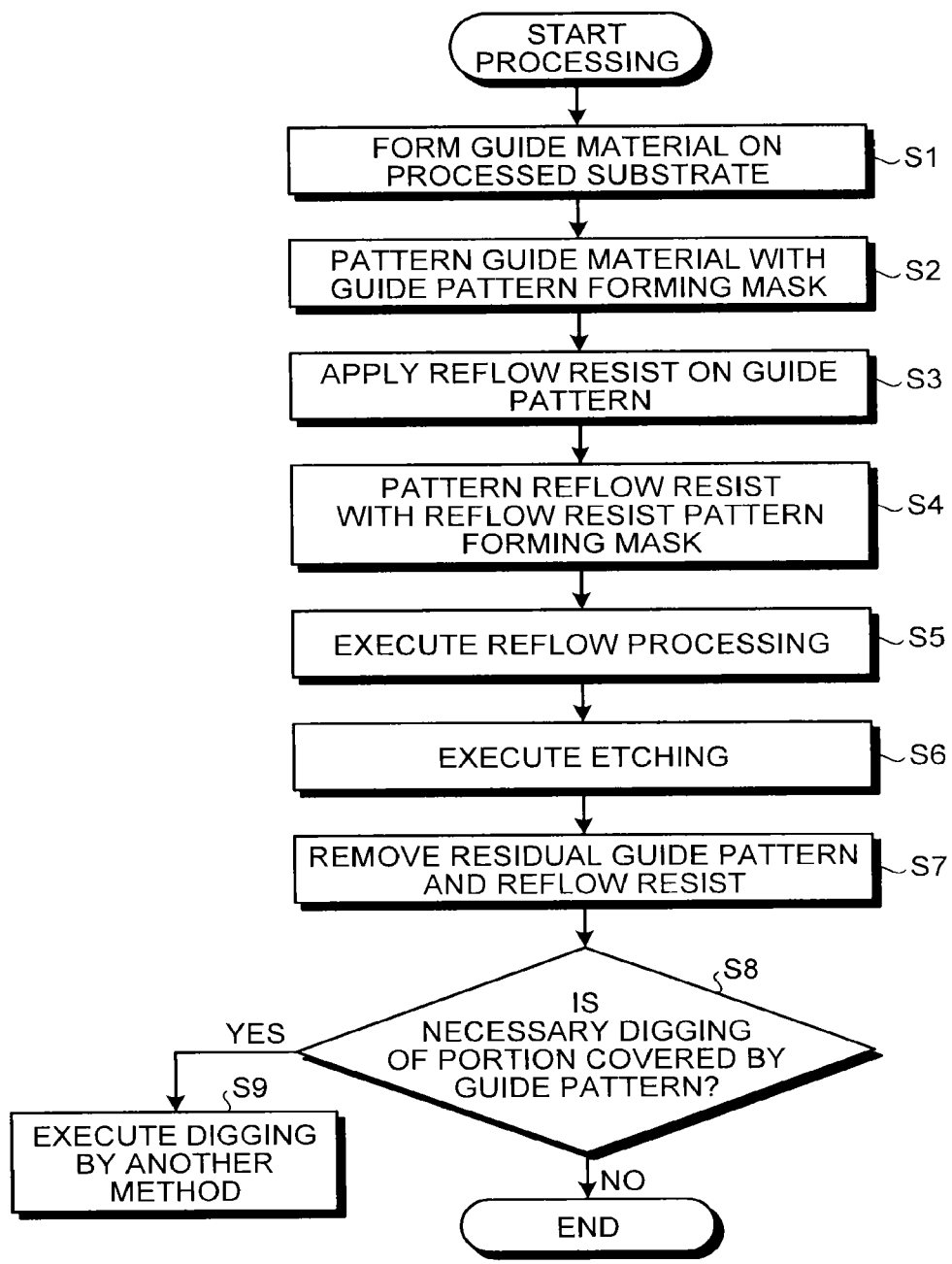
FIG. 5 is a flowchart of a manufacturing method for a semiconductor device according to a fourth embodiment.

FIG. 5 is a flowchart of a manufacturing method for a semiconductor device according to a fourth embodiment.

Referring to FIG. 5, a guide material is formed on a processed substrate (S1). The processed substrate may be the stacked body TA in FIG. 1B, for example. Next, the guide material is patterned with a guide pattern forming mask to form a guide pattern on the processed substrate (S2). The guide pattern may be the guide pattern G in FIG. 1A, for example. Next, a reflow resist is applied to the guide pattern (S3). Then, the reflow resist is patterned with a reflow resist pattern forming mask to form an extracted pattern on the reflow resist (S4). The reflow resist pattern forming mask may be the exposure mask EM in FIG. 2C or the exposure mask EM' in FIG. 4A, for example. Next, the reflow resist is caused to reflow (S5) to flatten the reflow resist in each of regions divided by the guide pattern and cause differences in the film thickness of the reflow resist. Next, the processed substrate is etched via the reflow resist (S6) to form openings different in depth in the processed substrate. Next, after the etching, the residual guide pattern and reflow resist are removed (S7). Next, it is determined whether portions covered by the guide pattern need to be dug (S8). Then, when the portions covered by the guide pattern need to be dug, the portions covered by the guide pattern are dug (S9).

Figure 6:
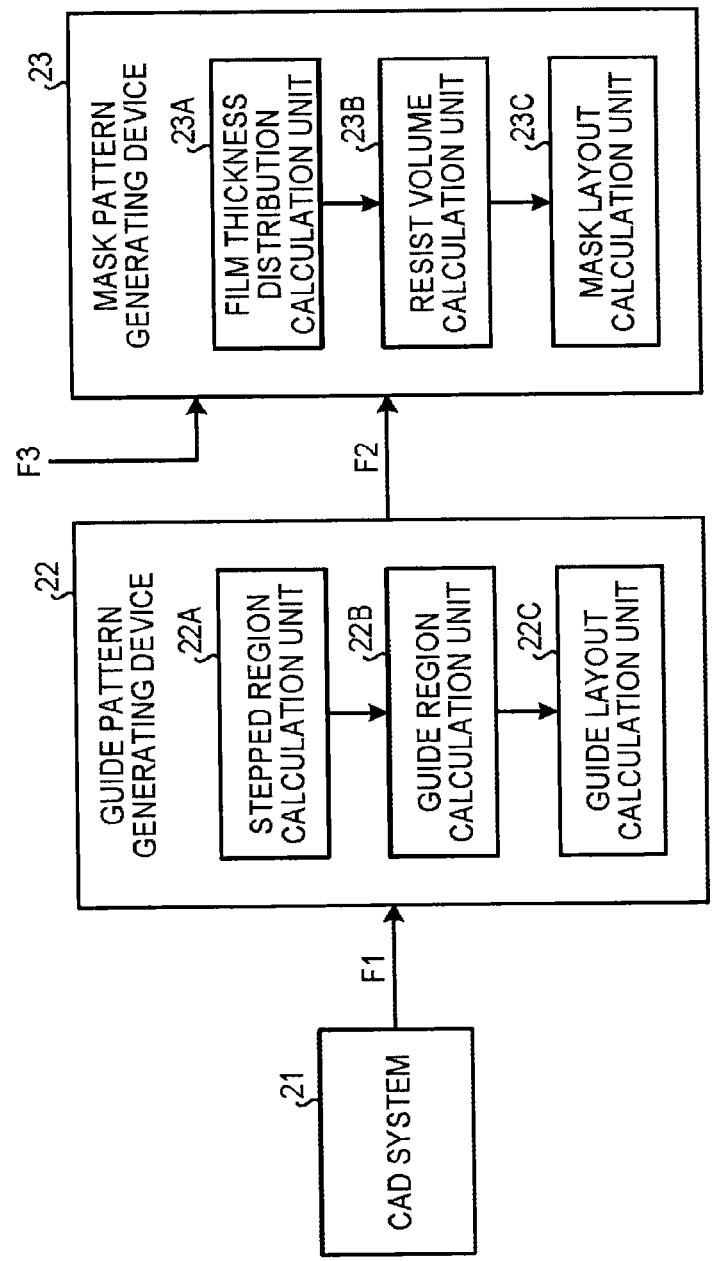
FIG. 6 is a schematic block diagram of a pattern generating device according to a fifth embodiment.

FIG. 6 is a schematic block diagram of a pattern generating device according to a fifth embodiment.

Referring to FIG. 6, the pattern generating device includes a guide pattern generating device 22 and a mask pattern generating device 23. As a peripheral for the pattern generating device, a CAD system 21 is provided. The guide pattern generating device 22 is provided with a stepped region calculation unit 22A that extracts a stepped region in a three-dimensional structure, a guide region calculation unit 22B that calculates a guide region around the stepped region, and a guide layout calculation unit 22C that lays out a guide pattern in the guide region. The mask pattern generating device 23 is provided with a film thickness distribution calculation unit 23A that calculates a film thickness distribution of a resist necessary for obtaining different depths of openings in the three-dimensional structure, a resist volume calculation unit 23B that calculates the volume of the resist necessary for obtaining the film thickness distribution calculated by the film thickness distribution calculation unit 23A in each of the openings, and a mask layout calculation unit 23C that calculates a mask layout necessary for obtaining the volumes calculated by the resist volume calculation unit 23B.

In the CAD system 21, designed layout data F1 for the three-dimensional structure is created for each of the layers and sent to the guide pattern generating device 22. Then, the stepped region calculation unit 22A extracts a stepped region from the designed layout data F1 for each of the layers. The guide region calculation unit 22B extracts a guide region surrounding the bottom portion of the stepped region from the three-dimensional structure. The guide region may be set at a flat portion of the three-dimensional structure. The guide region preferably has no influence on operations of the three-dimensional structure acting as a device. Further, the guide region preferably has no influence on the process of the three-dimensional structure as a device. Then, the guide layout calculation unit 22C lays out a guide pattern surrounding the bottom portion of the stepped region in the guide region. Layout information F2 for the guide pattern is sent to the mask pattern generating device 23. In addition, the mask pattern generating device 23 receives input of depth information F3 of openings different in depth in the three-dimensional structure. The depth information F3 may be given by a distance from the surface of the three-dimensional structure to the bottom portion of the stepped region. The film thickness distribution calculation unit 23A calculates the film thickness of a resist in each of the openings necessary for obtaining the depth of the opening in the three-dimensional structure. The resist volume calculation unit 23B calculates the volume of the resist in each of the openings necessary for obtaining the film thickness distribution calculated by the film thickness distribution calculation unit 23A. Next, the mask layout calculation unit 23C generates an extracted pattern in each of the openings necessary for obtaining the volume calculated by the resist volume calculation unit 23B. The extracted patterns may be the extracted patterns NP1 to NP3 in FIG. 3A, for example.

Figure 7:
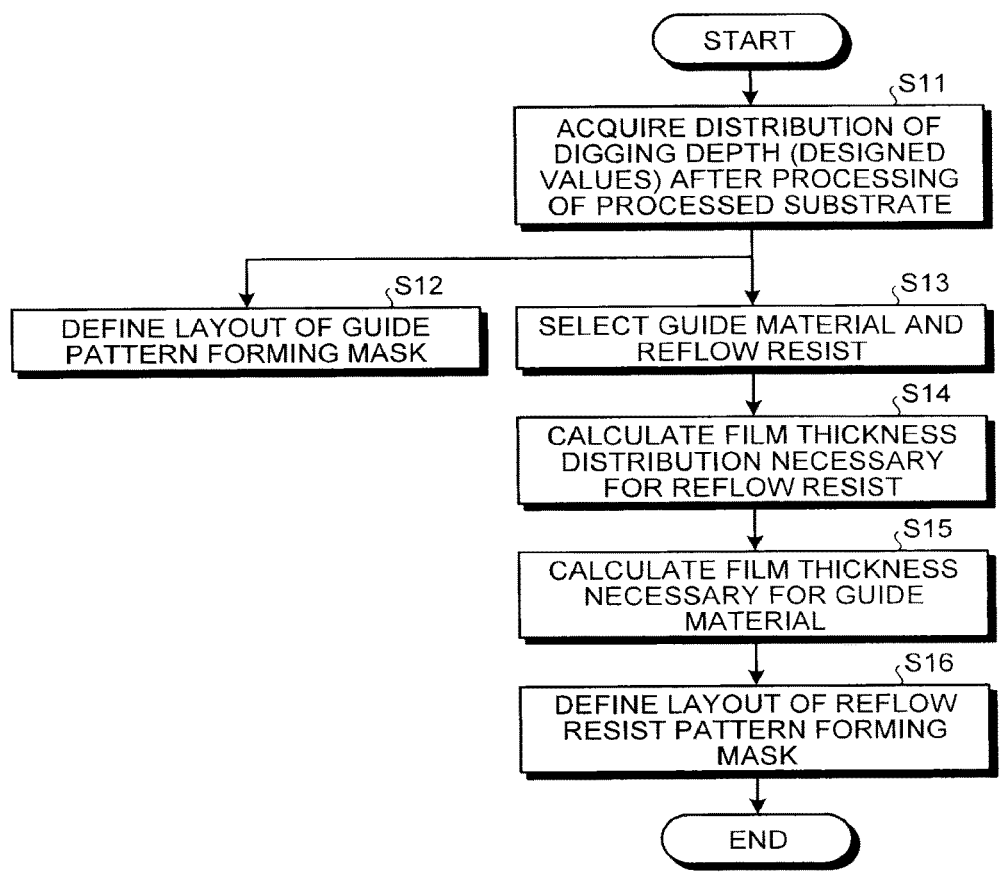
FIG. 7 is a flowchart of a pattern layout method according to a sixth embodiment.

FIG. 7 is a flowchart of a pattern layout method according to a sixth embodiment.

Referring to FIG. 7, a distribution of digging depth after the processing of the processed substrate is acquired (S11). The digging depth may be given by a designed value. Next, a layout of a guide pattern forming mask is defined (S12). In addition, a guide pattern material and a reflow resist are selected. At that time, the guide pattern material may be selected such that, at reflow of the reflow resist, the guide pattern material does not reflow (S13). Next, a film thickness distribution necessary for the reflow resist is calculated according to the distribution of digging depth after the processing (S14). Next, the film thickness necessary for the guide material is calculated such that the guide pattern is left when the distribution of digging depth after the processing is obtained (S15). Next, a layout of a reflow resist pattern forming mask is defined (S16).

Figure 8:
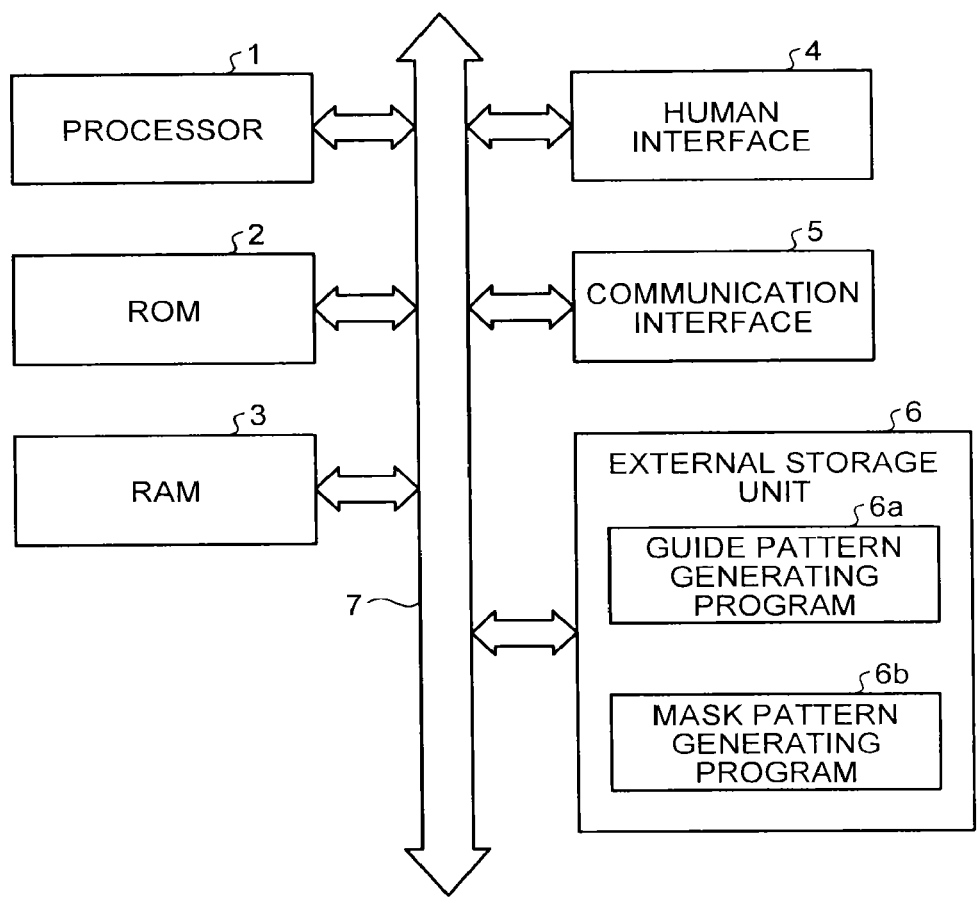
FIG. 8 is a block diagram of a hardware configuration of the pattern generating device in FIG. 6.

FIG. 8 is a block diagram of a hardware configuration of the pattern generating device in FIG. 6.

Referring to FIG. 8, the pattern generating device in FIG. 6 may be provided with a processor 1 including a CPU and the like, a ROM 2 storing fixed data, a RAM 3 providing a work area and the like for the processor 1, a human interface 4 intervening between a human and a computer, a communication interface 5 providing an external communication means, and an external storage unit 6 storing programs and various data for operating the processor 1. The processor 1, the ROM 2, the RAM 3, the human interface 4, the communication interface 5, and the external storage unit 6 are connected together via a bus 7.

The external storage unit 6 may be a magnetic disc such as a hard disc, an optical disc such as a DVD, or a portable semiconductor storage unit such as a USB memory or a memory card. The human interface 4 may be a keyboard, a mouse, or a touch panel as an input interface, and may be a display or a printer as an output interface, for example. The communication interface 5 may be a LAN card, a modem, a router, or the like, for connection with the internet or a LAN. The external storage unit 6 has a guide pattern generating program 6a and a mask pattern generating program 6b installed therein.

When the guide pattern generating program 6a is executed by the processor 1, the stepped region in the three-dimensional structure is extracted and the guide pattern surrounding the bottom portion of the stepped region is generated. In addition, when the mask pattern generating program 6b is executed by the processor 1, the film thickness of the resist necessary for obtaining a depth to the bottom portion of the stepped region is calculated in each of the openings, and an extracted pattern necessary for obtaining the film thickness after reflow is generated in each of the openings.

The guide pattern generating program 6a and the mask pattern generating program 6b to be executed by the processor 1 may be stored in the external storage unit 6 and read into the RAM 3 at execution of the program, or may be stored in advance in the ROM 2, or may be acquired via the communication interface 5. In addition, the guide pattern generating program 6a and the mask pattern generating program 6b may be executed at a standalone computer or a cloud computer.

Figure 9:
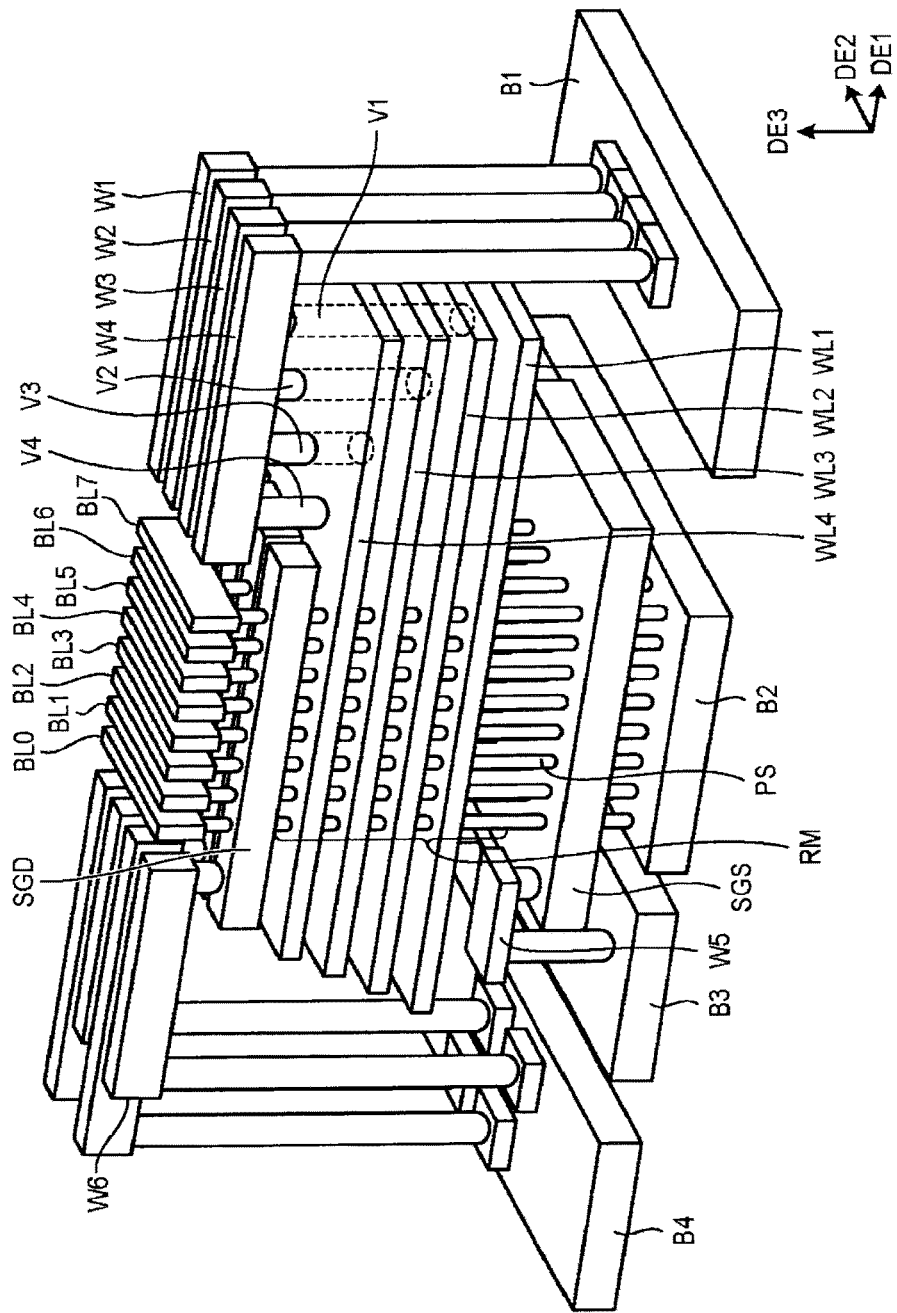
FIG. 9 is a schematic perspective view of a nontransitory semiconductor storage medium according to a seventh embodiment.

FIG. 9 is a schematic perspective view of a nontransitory semiconductor storage medium according to a seventh embodiment. In the example of FIG. 9, four word lines are stacked and eight bit lines are provided.

Referring to FIG. 9, a nontransitory semiconductor storage medium is provided with a cell array region RM. In the cell array region RM, word lines WL1 to WL4 are sequentially stacked in a depth direction DE3 to form a three-dimensional structure. Columnar bodies PS penetrate through the word lines WL1 to WL4 to form memory cells at intersections between the columnar bodies PS and the word lines WL1 to WL4. At that time, the columnar bodies PS are aligned two-dimensionally in a row direction DE1 and in a column direction DE2 to arrange the memory cells three-dimensionally in the cell array region RM. In the example of FIG. 9, eight memory cells are arranged in the row direction DE1, four memory cells in the column direction DE2, and four memory cells in the depth direction DE3. The word lines WL1 to WL4 can share the memory cells in the same rows and the same columns. A source-side select gate line SGS is provided under the cell array region RM. A drain-side select gate line SGD is provided above the cell array region RM. The drain-side select gate line SGD is separated by row. A source layer B2 is provided under the source-side select gate line SGS. In addition, a word line drive circuit B1, a source-side select gate line drive circuit B3, and a drain-side select gate line drive circuit B4 are arranged in parallel to the source layer B2. The word line drive circuit B1, the source layer B2, the source-side select gate line drive circuit B3, and the drain-side select gate line drive circuit B4 may be formed on a semiconductor substrate.

An extracted line W5 is formed above the source-side select gate line SGS. The source-side select gate line SGS is connected to the source-side select gate line drive circuit B3 via the extracted line W5. Bit lines BL0 to BL7 are formed in the column direction DE2 above the drain-side select gate line SGD. In addition, an extracted line W6 is formed in the row direction DE1 above the drain-side select gate line SGD. The drain-side select gate line SGD is connected to the drain-side select gate line drive circuit B4 via the extracted line W6. Extracted lines W1 to W4 are formed in the row direction DE1 above the word line WL4 corresponding to the word lines WL1 to WL4, respectively. The word lines WL1 to WL4 are connected to the word line drive circuit B1 via the extracted lines W1 to W4, respectively.

The word line WL1 is connected to the extracted line W1 via a contact plug V1. The contact plug V1 penetrates through the word lines WL2 to WL4 and is electrically connected to the word line WL1. The word line WL2 is connected to the extracted line W2 via a contact plug V2. The contact plug V2 penetrates through the word lines WL3 and WL4 and is electrically connected to the word line WL2. The word line WL3 is connected to the extracted line W3 via a contact plug V3. The contact plug V3 penetrates through the word line WL4 and is electrically connected to the word line WL3. The word line WL4 is connected to the extracted line W4 via a contact plug V4. The contact plug V4 is electrically connected to the word line WL4.

Figure 10A:
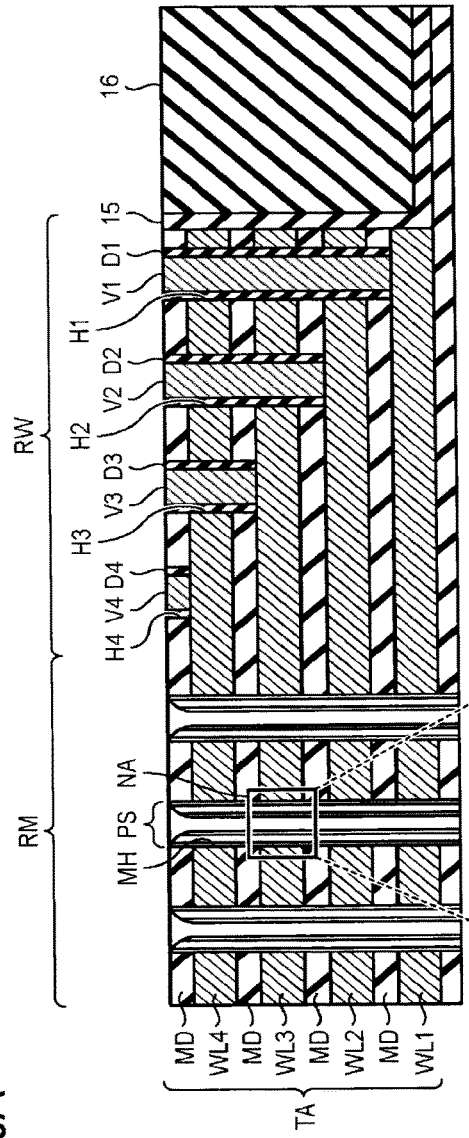
FIG. 10A is a schematic cross-sectional view of the nontransitory semiconductor storage medium according to the seventh embodiment and FIG. 10B is an enlarged cross-sectional view of a memory cell in FIG. 10A.
Figure 10B:
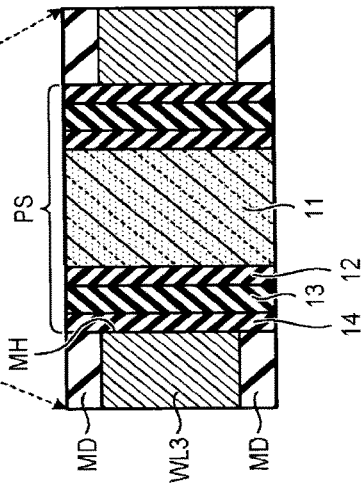

FIG. 10A is a schematic cross-sectional view of the nontransitory semiconductor storage medium according to the seventh embodiment and FIG. 10B is an enlarged cross-sectional view of a memory cell in FIG. 10A.

Referring to FIG. 10A, inter-layer insulating films MD are formed between the word lines WL1 to WL4. The word lines WL1 to WL4 and the inter-layer insulating films MD are alternately stacked in the depth direction DE3 to form the stacked body TA. The material for the word lines WL1 to WL4 may be an impurity-added polysilicon or a metal such as W. The material for the inter-layer insulating films MD may be silicon oxide films, for example. In this example, a word line extracted region RW is provided in the stacked body TA adjacent to the cell array region RM. Insulating films 15 and 16 are formed around the stacked body TA.

In the cell array region RM, memory holes MH are formed in such a manner as to penetrate through the word lines WL1 to WL4 in the depth direction DE3. Columnar bodies PS are embedded into the memory holes MH to form memory cells NA at intersections with the word lines WL1 to WL4.

As illustrated in FIG. 10B, a columnar semiconductor 11 is formed at the center of the columnar body PS. A tunnel insulating film 12 is formed between the inner surface of the memory hole MH and the columnar semiconductor 11. A charge trap layer 13 is formed between the inner surface of the memory hole MH and the tunnel insulating film 12. A block insulating film 14 is formed between the inner surface of the memory hole MH and the charge trap layer 13. The columnar semiconductor 11 may be a semiconductor such as Si, for example. An insulator may be embedded along the central axis of the columnar semiconductor 11. The tunnel insulating film 12 and the block insulating film 14 may be silicon oxide films, for example. The charge trap layer 13 may be a silicon nitride film, an ONO film (three-layer structure of silicon oxide film/silicon nitride film/silicon oxide film), or an ONOS film (four-layer structure of silicon oxide film/silicon nitride film/silicon oxide film/silicon oxynitride film), for example.

Meanwhile, in the word line extracted region RW, the stacked body TA has contact holes H1 to H4 different in depth as illustrated in FIG. 10A. The contact hole H1 penetrates through the word lines WL2 to WL4 and the inter-layer insulating films MD, and reaches the word line WL1. The contact hole H2 penetrates through the word lines WL3 and WL4 and the inter-layer insulating films MD, and reaches the word line WL2. The contact hole H3 penetrates through the word line WL4 and the inter-layer insulating films MD, and reaches the word line WL3. The contact hole H4 penetrates through the inter-layer insulating film MD and reaches the word line WL4. The contact holes H1 to H4 have side walls with side-wall insulating films D1 to D4. The material for the side-wall insulating films D1 to D4 may be silicon oxide films, for example. The contact plug V1 is embedded into the contact hole H1 to be insulated by the side-wall insulating film D1 from the word lines WL2 to WL4. The contact plug V2 is embedded into the contact hole H2 to be insulated by the side-wall insulating film D2 from the word lines WL3 and WL4. The contact plug V3 is embedded into the contact hole H3 to be insulated by the side-wall insulating film D3 from the word line WL4. The contact plug V4 is embedded into the contact hole H4 via the side-wall insulating film D4.

Forming the contact holes H1 to H4 different in depth in the stacked body TA eliminates the need to form steps between the word lines WL1 to WL4 before the formation of the contact holes H1 to H4, thereby resulting in reduction of the number of processes.

Figure 11:
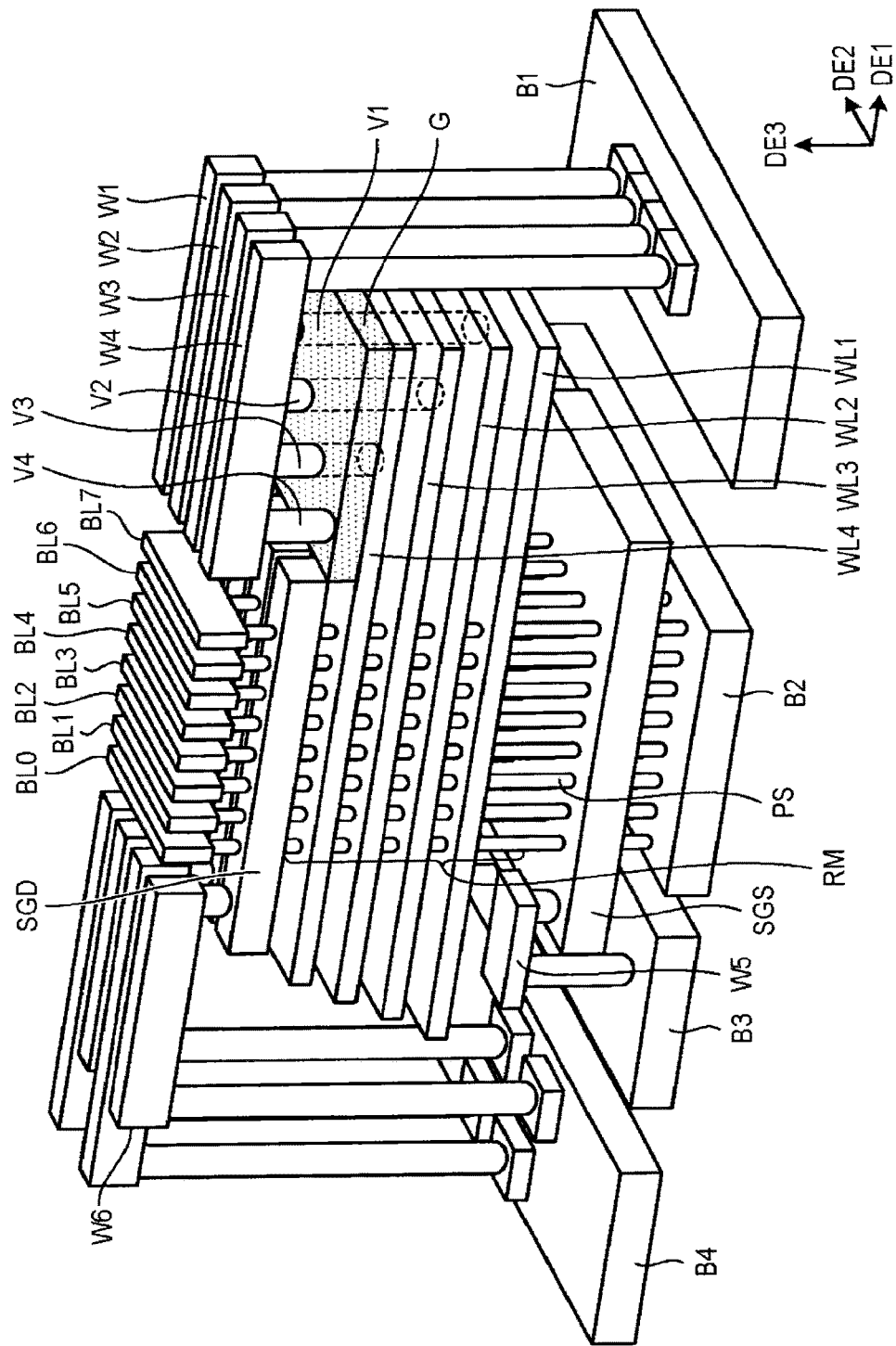
FIG. 11 is a schematic perspective view of a nontransitory semiconductor storage medium according to an eighth embodiment.

FIG. 11 is a schematic perspective view of a nontransitory semiconductor storage medium according to an eighth embodiment.

In the configuration of FIG. 10, the guide pattern G is removed from the stacked body TA. Alternatively, as illustrated in FIG. 11, the guide pattern G may be left on the stacked body TA. In this case, the process of removing the guide pattern G can be omitted to reduce the number of processes.

In the foregoing embodiments, contact holes different in depth are formed as an example. Alternatively, the present invention may be applied to an example in which ion-implanted layers different in depth are formed on a processed substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method for a semiconductor device, comprising:

forming a three-dimensional structure on a semiconductor substrate;

forming a guide pattern corresponding to openings in the three-dimensional structure on the three-dimensional structure;

forming resist films different in thickness divided by the guide pattern on the three-dimensional structure;

etching the three-dimensional structure via the resist films such that the openings are different in depth, wherein the forming resist films different in thickness divided by the guide pattern on the three-dimensional structure includes:

forming resist films equal in thickness and different in area in the guide pattern on the three-dimensional structure; and reflowing the resist films to cause differences in the thickness of the resist films.

2. The manufacturing method for a semiconductor device of claim 1, wherein differences are made in crude density of a light-shielding pattern in an exposure mask for use in light exposure of the resist films to cause differences in areas of the resist films.

* * * * *